United States Patent [19]
Fries et al.

[11] Patent Number: 6,020,627
[45] Date of Patent: Feb. 1, 2000

[54] CHIP CARD AND METHOD OF MANUFACTURING A CHIP CARD

[75] Inventors: Manfred Fries, Hunderdorf; Thies Janczek, Molfsee, both of Germany

[73] Assignee: Siemens Aktiengesellschaft, Munich, Germany

[21] Appl. No.: 09/152,829

[22] Filed: Sep. 14, 1998

Related U.S. Application Data

[63] Continuation of application No. PCT/DE97/00409, Mar. 4, 1997.

[30] Foreign Application Priority Data

Mar. 12, 1996 [DE] Germany .......................... 196 09 636

[51] Int. Cl.[7] ................................................. H01L 23/02
[52] U.S. Cl. ............................ 257/679; 257/690; 257/702
[58] Field of Search .................................... 257/679, 690, 257/702

[56] References Cited

U.S. PATENT DOCUMENTS 3,637,994  1/1972  Ellingboe .
4,709,254  11/1987  Haghiri-Tehrani et al. .
5,677,568  10/1997  Ochi et al. .

FOREIGN PATENT DOCUMENTS

| 0 671 705 A2 | 9/1995 | European Pat. Off. . |
| 0 682 321 A2 | 11/1995 | European Pat. Off. . |
| 44 16 697 A1 | 11/1995 | Germany . |
| 44 31 603 A1 | 3/1996 | Germany . |
| 195 00 925 A1 | 7/1996 | Germany . |

*Primary Examiner*—David E. Graybill
*Attorney, Agent, or Firm*—Herbert L. Lerner; Laurence A. Greenberg

[57] ABSTRACT

A chip card for the contactless transmission of electric signals to a terminal includes a card body in which a coupling element having conductor tracks and contact connections, and a semiconductor chip having an electronic circuit associated with the coupling element, are constructed in an integrated manner. The semiconductor chip is provided on its surface with contact elements for electrical connection of the electronic circuit and the contact connections of the coupling element. A carrier made of an electrically insulating material supports at least part of the conductor tracks and the contact connections of the coupling element. The carrier is provided with an aperture in the vicinity of the contact connections of the coupling element, for receiving the semiconductor chip.

14 Claims, 1 Drawing Sheet

CHIP CARD AND METHOD OF MANUFACTURING A CHIP CARD

CROSS REFERENCE TO RELATED APPLICATION

This application is a continuation of International Application No. PCT/DE97/00409, filed Mar. 4, 1997, which designated the United States.

BACKGROUND OF THE INVENTION

FIELD OF THE INVENTION

The invention relates to a chip card for the contactless transmission of electric signals to a terminal, including a card body in which a coupling element having conductor tracks and contact connections, and a semiconductor chip having an electronic circuit associated with the coupling element, are constructed in an integrated manner, contact elements provided on the surface of the semiconductor chip for electrical connection of the electronic circuit and the contact connections of the coupling element, and a carrier of an electrically insulating material supporting at least part of the conductor tracks and the contact connections of the coupling element. The invention also relates to a method of manufacturing such a chip card.

A contactless chip card as described above has become known from Published European Patent Application 671 705 A, in which an electrical connection between a coupling element and a semiconductor chip is achieved by using bonding wires and connecting pieces penetrating a carrier layer and provided with angled connecting surfaces.

Possible applications of chip cards, which are generally constructed in a check card format, have become extremely widespread because of a high functional flexibility and are increasing further with rising computing power and memory capacity of available integrated circuits. In addition to the fields of application which are typical at present for such chip cards in the form of health insurance cards, flex-time registration cards and telephone cards, the future will yield applications in electronic payment transactions, in computer-aided access control, in protected data memories and the like, in particular.

With regard to the type of coupling to a terminal or a reader, a distinction is drawn between chip cards having contacts and so-called contactless chip cards. In the case of a chip card having contacts, contact is made through the use of a metallic contact field having contact elements which are usually standardized in accordance with an ISO standard. The reliability of chip cards having contacts has been able to be continuously improved in previous years because of the increasing production experience of manufacturers. As a result, for example, the failure rate of telephone cards with a lifetime of one year is nowadays distinctly below one per thousand. Nevertheless, contacts are still one of the most frequent sources of faults in electromechanical systems.

Disturbances can be produced, for example, by contamination or wear of the contacts. Vibration can lead to short-term contact interruptions in the case of employment in mobile devices. Since the contacts on the surface of the chip card have to be connected directly to the inputs of the integrated circuit, there is, furthermore, the risk that electrostatic discharges may weaken or even destroy the integrated circuit in the interior of the card. Those technical problems are circumvented by the contactless chip card. In addition to those technical advantages, the contactless chip card furthermore offers a series of interesting new possibilities of applications for the card issuer and the card user. Thus, for example, contactless chip cards do not necessarily have to be inserted into a card reader. Instead, there are systems which function over a distance of up to one meter.

One broad field of application is represented, for example, by public local personal transport, where as many persons as possible have to be registered in as short a time as possible.

In addition to further advantages, the contactless chip card offers the advantage of ensuring that no technical elements are visible on the card surface, with the result that the visual configuration of the card surface is not restricted by magnetic strips or contact areas.

The disadvantages in the case of contactless chip cards which are available at present primarily reside in the additional components, such as transmission coils or capacitor plates, which have to be integrated into the card. That leads to the fact that, up until now, the manufacture of contactless chip cards has been distinctly more expensive than the comparable cards having contacts. Furthermore, the electronics which is necessary in the contactless chip card for the contactless transmission of electric signals to the terminal is more complicated. In principle, circuits which are suitable therefor are those which enable signal transmission through the use of microwaves, optical signals, capacitive or inductive coupling. The capacitive and the inductive coupling are most suitable because of the flat structural shape of the chip card. At present, in the case of most contactless cards, the transmission is carried out in an inductive manner, with which both the data and the power transmission may be realized. Thus, one or more induction coils are constructed in an integrated manner in the card body as coupling elements. The transmission of electric signals is carried out according to the principle of the loosely coupled transformer. The carrier frequency lies, for example, in the range between 100 and 300 kHz or at a few MHz, in particular the industrial frequency of 13.56 MHz. For that purpose, induction coils are needed which have coil areas that are typically about 30 to 40 cm$^2$. That is significantly larger than the base area of the semiconductor chip which is on the order of magnitude of about 10 mm$^2$. The induction coils have to be contacted in a suitable manner by the circuit which is located on the semiconductor chip. In that case, the semiconductor components are assembled onto the etched coil in the form of prefabricated modules or directly as a chip. The chip module which is present as a separate assembly, together with the induction coil which generally has only a few turns and has a flat construction, is laminated into the card body in order to complete the chip card. Intermediate foils, if appropriate, are provided with stampings being fitted as inlay foils for equalizing the volume during the lamination.

SUMMARY OF THE INVENTION

It is accordingly an object of the invention to provide a contactless chip card and a method for manufacturing a contactless chip card, which overcome the hereinafore-mentioned disadvantages of the heretofore-known devices and methods of this general type, which ensure simpler assembly of a coupling element with a semiconductor chip and which at the same time ensure high reliability and long lifetime of the contactless chip card.

With the foregoing and other objects in view there is provided, in accordance with the invention, a chip card for the contactless transmission of electric signals to a terminal, comprising a card body having an integrated coupling element with conductor tracks and contact connections and an integrated semiconductor chip with a surface, given dimensions and an electronic circuit associated with the coupling element; contact elements disposed on the surface of the semiconductor chip for electrical connection of the electronic circuit and the contact connections of the coupling element; a carrier of an electrically insulating material supporting at least a part of the conductor tracks and the contact connections of the coupling element; and the carrier having an aperture formed therein in the vicinity of the contact connections of the coupling element, the aperture corresponding to the given dimensions for receiving the semiconductor chip, and the conductor tracks of the coupling element led across the aperture.

The invention makes it possible to achieve a series of advantages over the previously known contactless chip cards. On one hand, given a low adjustment effect, the coupling element can be assembled more simply with the semiconductor chip, since the conductor tracks and the contact connections of the coupling element can be supported on the carrier. In addition, since the semiconductor chip is received in the aperture of the carrier, a chip card module including the semiconductor chip and the coupling element can be made available with a minimum overall height.

In the previously known configurations, elevations remain following the assembly of the semiconductor assemblies in the form of modules or directly as a chip onto the coupling element. The elevations can be subjected to mechanical damage and interfere during the further construction of the chip card. For that reason, the previously known configurations require the use of intermediate foils provided with stampings for equalizing volume during the later lamination process of the chip card. In comparison, in the case of the configuration according to the invention, there are elevations which are negligible in any case, essentially because of the conductor tracks on the supported carrier being very thin. As a result the further production of the card body of the chip card can be carried out without the use of volume equalizing intermediate foils and intermediate laminates.

In accordance with another feature of the invention, an insulating layer is provided on that surface of the semiconductor chip which faces the coupling element, in the region between the connecting elements of the semiconductor chip, the insulating layer is formed of electrically insulating material and at least some of the conductor tracks of the coupling element are supported or freely guided on the insulating layer of the semiconductor chip. In this way, the insulating layer, which is generally present anyway on the semiconductor chip and is made, for example, of polyimide material, can be used at the same time for the electrical insulation of the conductor tracks of the coupling element. The conductor tracks, which have a generally strip-shaped construction and are very sensitive to mechanical stresses, are able to be supported, at least partially, on the insulating layer of the semiconductor chip.

In accordance with a further feature of the invention, the surface of the semiconductor chip which faces the coupling element, and the surface of the carrier which faces the coupling element, are aligned at least approximately flush with one another.

In accordance with an added feature of the invention, the thickness of the carrier and/or the depth of the aperture receiving the semiconductor chip correspond to the overall thickness of the semiconductor chip. In order to increase the mechanical stability and to enlarge the processing safety, relatively thick carrier material can be used which has a thickness of, for example, about 500 μm, corresponding to the semiconductor chip thickness. Therefore, the semiconductor chip itself does not need to be made thinner, and the susceptibility to breakage of the chip in the card is reduced. The aperture receiving the semiconductor chip advantageously represents a perforation extending over the entire thickness of the carrier, which can preferably be made through the use of chemical etching or thermal decomposition.

In accordance with an additional feature of the invention, the coupling element which is associated with the electronic circuit of the semiconductor chip has one or more, in particular helical, induction coils which are flat with only a few turns, and has coil peripheries or coil diameters that are substantially larger than the external dimensions of the semiconductor chip. Assuming typical base areas of the semiconductor chip of about 10 mm$^2$, the base areas of the induction coils being used are in the range from about 30 to about 40 cm$^2$. In this case, the induction coil has high coil Q values in the radio-frequency range, typically Q>25 at C=8 pF and L=4.2 μH. In this case, the electrically active area of the coupling element advantageously corresponds approximately to the total area of the chip card, so that the maximum card area can be utilized with regard to the size of the induction coil. For the purpose of the complete mechanical support of the turns of the induction coil, the carrier has an external periphery corresponding to the induction coil, that is to say once more corresponding to the maximum possible card area.

In accordance with yet another feature of the invention, the carrier for supporting the coupling element is made of a flexible material, for example a high-temperature-stable plastic material such as polyimide. Furthermore, polyethylene or polyvinyl chloride (PVC) can also be used as the material of the carrier. Additionally, in order to simplify the adjustment: of the semiconductor chip and the coupling element, the carrier can in particular also be manufactured from a transparent or at least translucent plastic material, for example from ABS or PC/PBT, in order to enable optical access, for example for a double-image camera.

In accordance with yet a further feature of the invention, the conductor tracks of the coupling element constitute the turns of the induction coil, which are made through the use of an etching process. The conductor tracks and the contact connections of the coupling element can be printed through the use of a chemical etching process on a coil foil made of copper, using photolithographic processes which are known per se.

In accordance with yet an added feature of the invention, the turns of the conductor tracks, which have a strip-shaped construction, lie alongside one another without crossing on the coil foil made of copper, and the contact connections of the induction coil are constructed on the ends of the turns.

In accordance with yet an additional feature of the invention, the aperture for receiving the semiconductor chip is disposed at the edge region of the chip card, where the lowest bending stresses occur and a maximum card inner surface to be machined is made available.

In order to increase the mechanical protection of the semiconductor chip, a protective ring or a compound of a suitable consistency which hardens in a dimensionally stable manner (for example a so-called Glob Top), can be applied on the carrier.

With the objects of the invention in view there is also provided a method of manufacturing a chip card for the contactless transmission of electric signals to a terminal, which comprises integrating a coupling element with conductor tracks and contact connections, into a card body; integrating a semiconductor chip with an electronic circuit associated with the coupling element, into the card body; placing contact elements on a surface of the semiconductor chip for electrical connection of the electronic circuit and the contact connections of the coupling element; supporting at least a part of the conductor tracks and the contact connections of the coupling element with a carrier of an electrically insulating material; making an aperture in the carrier in the vicinity of the contact connections of the coupling element; inserting the semiconductor chip into the aperture in the carrier with the contact elements of the semiconductor chip facing the contact connections and the conductor tracks of the coupling element led across the aperture; and connecting the contact elements of the semiconductor chip to the contact connections of the coupling element.

In accordance with another mode of the invention, during the production of the chip card, the aperture or the perforation in the carrier for receiving the semiconductor chip is made after the completion of the assembly of the carrier and the coupling element. Following the application of the copper-laminated induction coil to the carrier, a photoresist layer can be applied to that surface of the carrier facing away from the coupling element, over the entire surface. That layer is structured for constructing an etching mask at the point of the aperture to be made. Following chemical etching of the carrier to produce the aperture or the perforation, the semiconductor chip is inserted into the aperture and electrical contacting between the contact elements of the semiconductor chip and the contact connections of the coupling element is undertaken. In this case, the coupling element can be previously provided on its underside with a lacquer which is resistant to the etching substance, that is to say on that side facing the carrier, as a protection against the etching measures for producing the aperture in the carrier. Alternatively, the aperture can be produced following the fitting of the coupling element onto the carrier through the use of chemically dissolving the carrier material or through the use of thermal decomposition of the carrier material.

In accordance with a concomitant mode of the invention, the aperture in the carrier for receiving the semiconductor chip is made before the assembly of the carrier and the coupling element, and is temporarily closed with a closure material which can be removed mechanically, chemically or thermally. In this case, the aperture in the carrier can be made previously by stamping or else by chemical or thermal methods. Subsequently, but still before the fitting of the coupling coil, the aperture is closed in a following step with a material which is mechanically stable but easy to remove, for example plastic material such as, for example, a polymer. The closure is removed, for example in a mechanical, chemical or thermal manner, and the semiconductor chip is mounted, following the fitting of the coupling element and the production of the conductor tracks and the contact connections of the coupling element, preferably through the use of structured etching of a copper-laminated coil foil. The closure material can in particular also be formed of a suitable wax material which can be removed in a simple way through the use of thermal melting following the lamination and etching of the induction coil. Then the semiconductor chip can be inserted into the free aperture in the carrier and be mounted with the coupling element.

Other features which are considered as characteristic for the invention are set forth in the appended claims.

Although the invention is illustrated and described herein as embodied in a chip card and a method of manufacturing a chip card, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
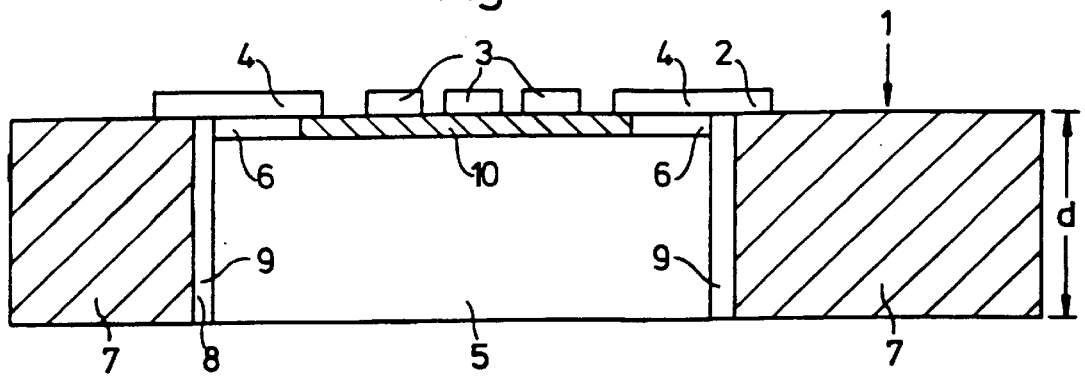
FIG. 1 is a diagrammatic, sectional view of a chip module to be inserted into a chip card, including a semiconductor chip, a coupling element and a carrier according to one exemplary embodiment of the invention.
Figure 2:
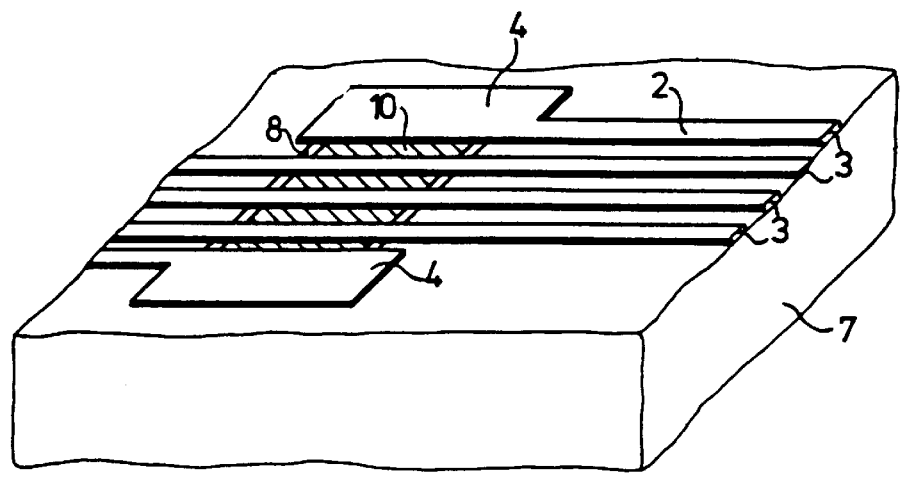
FIG. 2 is a fragmentary, perspective view of components according to FIG. 1.

Referring now to FIGS. 1 and 2 of the drawings in detail, there is seen an exemplary embodiment of the invention which includes a chip card 1 for contactless transmission of electric signals to a non-illustrated, stationary terminal, that is to say a so-called contactless chip card. The chip card 1 has an induction coil 2 as a coupling element with conductor tracks 3 that have a strip-shaped construction, are located alongside one another, have a spiral shape and represent coil turns, and contact connections 4 that are constructed at an end of each turn and have dimensions which are distinctly increased in relation to a width of the conductor tracks 3. For reasons of better clarity, only parts of the conductor tracks are shown in great detail in FIGS. 1 and 2. In actual fact, the induction coil 2 has significantly larger external dimensions, which make use of the maximum card area of the chip card 1 and approximately correspond to the external dimensions of the chip card. The induction coil 2 can be manufactured as a separate component by stamping or etching a copper-laminated coil carrier foil. In a manner that is known per se, the non-illustrated copper-laminated coil carrier foil is covered with an etching mask which corresponds to the structure of the conductor tracks 3 and the contact connections 4, is made of photoresist material, for example, and is treated by using suitable chemical etching measures.

The induction coil 2, being formed of copper, is in electrical contact with an electronic circuit which is accommodated in a semiconductor chip 5 in an integrated manner. The mode of operation of the electronic circuit is familiar to those skilled in the art and is thus likewise not represented in more detail in the figures. The semiconductor chip 5 is provided on its surface with electrically conductive contact elements 6 (so-called chip pads) which are connected electrically and mechanically to the contact connections 4 of the induction coil 2. A one-piece carrier 7 is provided for the purpose of mechanical support of the induction coil 2, in particular the mechanically extremely sensitive conductor tracks 3 of the induction coil 2. The one-piece carrier 7 is manufactured from polyimide material and is provided with an aperture 8 for receiving the semiconductor chip 5. The dimensions of the aperture 8 substantially correspond to the dimensions of the semiconductor chip 5, so that the latter can be received completely in the aperture. Taking into account assembly tolerances, the width of the aperture may turn out to be somewhat greater than the width of the semiconductor chip 5, so that small residual cavities 9 remain at side regions of the semiconductor chip, but do not interfere.

A thickness d of the carrier 7 corresponds precisely to an overall thickness of the semiconductor chip 5 together with a thickness of the contact element 6. As a result, a surface of the semiconductor chip facing the coupling element and a surface of the carrier 7 facing the coupling element, are essentially aligned flush with one another. In the case of commonly available chip thicknesses, the thickness of the carrier is about 400 to about 500 $\mu$m, so that it is possible to dispense with an additional reduction to be carried out in the thickness of the semiconductor chip. The outer periphery of the carrier almost corresponds to the outer periphery of the induction coil 2 and therefore essentially to the dimensions of the chip card itself, so that the induction coil 2 is completely supported on the carrier 7.

A thin insulating layer 10 of electrically insulating material, for example of polyimide, is provided between the contact elements 6. The insulating layer 10 is generally disposed anyway on the separately produced semiconductor chip and, in the case of the configuration according to the invention, is used as an electrically insulating supporting layer for that part of the conductor tracks of the induction coil 2 which runs on the semiconductor chip 5. The semiconductor chip 5 thus rests flush in the aperture 8, over which the conductor tracks 3 of the induction coils are led. The induction coil 2 is contacted and fastened with the semiconductor chip 5 by using a direct connection technique that is known per se, such as for example through the use of thermocompression or so-called flip-chip assembly, at the relatively broad contact elements 6 or contact pads.

The overall configuration of the chip module according to the invention, including the semiconductor chip 5, the carrier 7 and the induction coil 2, has a substantially planar surface by comparison with the previously known configurations. It can therefore be fed to the lamination with the further components of the card body during the further card production without the use of additional intermediate foils and the like. The thickness of the conductor tracks 3 or of the contact connections 4, which in this respect is represented in an exaggerated manner, in particular in FIG. 1, may be neglected, as compared with the overall thickness of the carrier 7 or of the semiconductor chip 5.

We claim:

1. A chip card for the contactless transmission of electric signals to a terminal, comprising:

a card body having an integrated coupling element with conductor tracks and contact connections and an integrated semiconductor chip with a surface, given dimensions and an electronic circuit associated with said coupling element;

contact elements disposed on said surface of said semiconductor chip for electrical connection of said electronic circuit and said contact connections of said coupling element;

a carrier of an electrically insulating material supporting at least a part of said conductor tracks and said contact connections of said coupling element; and said carrier having an aperture formed therein in the vicinity of said contact connections of said coupling element, said aperture corresponding to said given dimensions for receiving said semiconductor chip, and said conductor tracks of said coupling element led across said aperture.

2. The chip card according to claim 1, including an insulating layer of electrically insulating material disposed between said contact elements of said semiconductor chip on said surface of said semiconductor chip facing said coupling element, said insulating layer of said semiconductor chip disposed below at least a part of said conductor tracks of said coupling element led across said aperture.

3. The chip card according to claim 2, wherein at least some of said conductor tracks of said coupling element are supported on said insulating layer of said semiconductor chip.

4. The chip card according to claim 2, wherein at least some of said conductor tracks of said coupling element are freely guided on said insulating layer of said semiconductor chip.

5. The chip card according to claim 1, wherein said surface of said semiconductor chip facing said coupling element and a surface of said carrier facing said coupling element are aligned at least approximately flush with one another.

6. The chip card according to claim 1, wherein said semiconductor chip has a given overall thickness, said carrier has a given thickness, said aperture receiving said semiconductor chip has a given depth, and at least one of said given thickness and said given depth corresponds to said given overall thickness.

7. The chip card according to claim 1, wherein said semiconductor chip has given external dimensions, said coupling element associated with said electronic circuit of said semiconductor chip has at least one induction coil with a coil periphery substantially larger than said given external dimensions, and said carrier has an external periphery essentially corresponding to said coil periphery.

8. The chip card according to claim 7, wherein said conductor tracks of said coupling element are turns of said induction coil made by an etching process.

9. The chip card according to claim 1, wherein said carrier of electrically insulating material supporting said coupling element is a foil with even surfaces.

10. The chip card according to claim 1, wherein said carrier is formed of a temperature-stable, flexible plastic material.

11. The chip card according to claim 10, wherein said material is a polyimide.

12. The chip card according to claim 1, wherein said coupling element has an electrically active area corresponding at least approximately to a total area of the chip card.

13. The chip card according to claim 1, wherein said aperture for receiving said semiconductor chip is disposed at an edge region of the chip card.

14. The chip card according to claim 8, wherein said turns of said conductor tracks are strip-shaped, lie alongside one another without crossing on said carrier and have ends, and said contact connections are disposed at said ends of said turns of said induction coil.

\* \* \* \* \*